United States Patent
Chen et al.

(10) Patent No.: US 8,816,771 B2
(45) Date of Patent: Aug. 26, 2014

(54) SIGNAL AMPLIFYING CIRCUIT WITH REDUCED OUTPUT SIGNAL NOISE BY INTRODUCING COUPLING EFFECT AND RELATED METHOD THEREOF

(75) Inventors: Hsien-Ku Chen, Taoyuan County (TW); Chia-Jun Chang, Taipei (TW); Ka-Un Chan, Hsinchu County (TW); Ying-Hsi Lin, Hsin-Chu (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 93 days.

(21) Appl. No.: 13/607,830

(22) Filed: Sep. 10, 2012

(65) Prior Publication Data
US 2013/0307620 A1 Nov. 21, 2013

(30) Foreign Application Priority Data

May 21, 2012 (TW) .............................. 101118002 A

(51) Int. Cl.
*H03F 3/45* (2006.01)
(52) U.S. Cl.
CPC ........................................ *H03F 3/45* (2013.01)
USPC ............ 330/253; 330/295; 330/302; 330/311
(58) Field of Classification Search
CPC ................................... H03F 3/45; H03F 3/191
USPC .................. 330/253, 277, 195, 165, 302, 311
See application file for complete search history.

(56) References Cited

U.S. PATENT DOCUMENTS

| 4,816,784 A * | 3/1989 | Rabjohn ..................... 333/24 R |
| 7,019,593 B2 * | 3/2006 | Krishnasamy Maniam et al. ............................ 330/302 |

* cited by examiner

*Primary Examiner* — Robert Pascal
*Assistant Examiner* — Khiem Nguyen
(74) *Attorney, Agent, or Firm* — Winston Hsu; Scott Margo

(57) ABSTRACT

A signal amplifying circuit includes: an input stage circuit, arranged to receive an input signal; a first inductive device coupled between the input stage circuit and a first reference voltage; an output stage circuit arranged to generate an output signal according to the input signal; and a second inductive device coupled between the output stage circuit and a second reference voltage, wherein at least a part of a winding of the first inductive element is cross-coupled to at least a part of a winding of the second inductive element.

14 Claims, 4 Drawing Sheets

SIGNAL AMPLIFYING CIRCUIT WITH REDUCED OUTPUT SIGNAL NOISE BY INTRODUCING COUPLING EFFECT AND RELATED METHOD THEREOF

BACKGROUND OF THE INVENTION

1. Field of the Invention

The present invention relates to a signal amplifying circuit and a signal amplifying method, and more particularly, to a low noise amplifier (LNA) with a lower noise figure and related method thereof.

2. Description of the Prior Art

In a wireless receiving system, a low noise amplifier is utilized to amplify a received wireless signal to generate a received signal. To make sure that the wireless receiving system extracts the data from the received signal accurately, the low noise amplifier should not introduce too much noise to the received signal such that the data in the received signal is prevented from being affected by the noise. In other words, the noise figure of the low noise amplifier should be low enough, thus ensuring the accuracy of the data in the received signal. Generally speaking, the noise figure of the low noise amplifier is affiliated with the field effect transistors used in the low noise amplifier. Specifically, the noise figure of the low noise amplifier is proportional to the channel noise coefficient and the gate noise coefficient of the field effect transistors, and the noise figure of the low noise amplifier is inversely proportional to the operating cutoff frequency of the field effect transistors. To put it another way, the wireless received signal would be affected by the noise of the field effect transistors so long as the low noise amplifier is composed of field effect transistors. Therefore, how to improve the noise figure of a low noise amplifier using a low-cost solution has become an issue in the pertinent field.

SUMMARY OF THE INVENTION

Therefore, one of the objectives of the present invention is to provide a low noise amplifier with a lower noise figure and the related method thereof.

In accordance with a first embodiment of the present invention, a signal amplifying circuit is proposed. The signal amplifying circuit includes an input stage circuit, a first inductive element, an output stage circuit, and a second inductive element. The input stage circuit is utilized for receiving an input signal. The first inductive element is coupled between the input stage circuit and a first reference voltage. The output stage circuit is utilized for generating an output signal according to the input signal. The second inductive element is coupled between the output stage circuit and a second reference voltage, wherein at least a part of the winding of the first inductive element is cross-coupled to at least a part of the winding of the second inductive element.

In accordance with a second embodiment of the present invention, a signal amplifying method is proposed. The signal amplifying method includes the steps: utilizing an input stage circuit to receive an input signal; coupling a first inductive element between the input stage circuit and a first reference voltage; utilizing an output stage circuit to generate an output signal according to the input signal; coupling a second inductive element between the output stage circuit and a second reference voltage; cross-coupling at least a part of the winding of the first inductive element to at least a part of the winding of the second inductive element.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
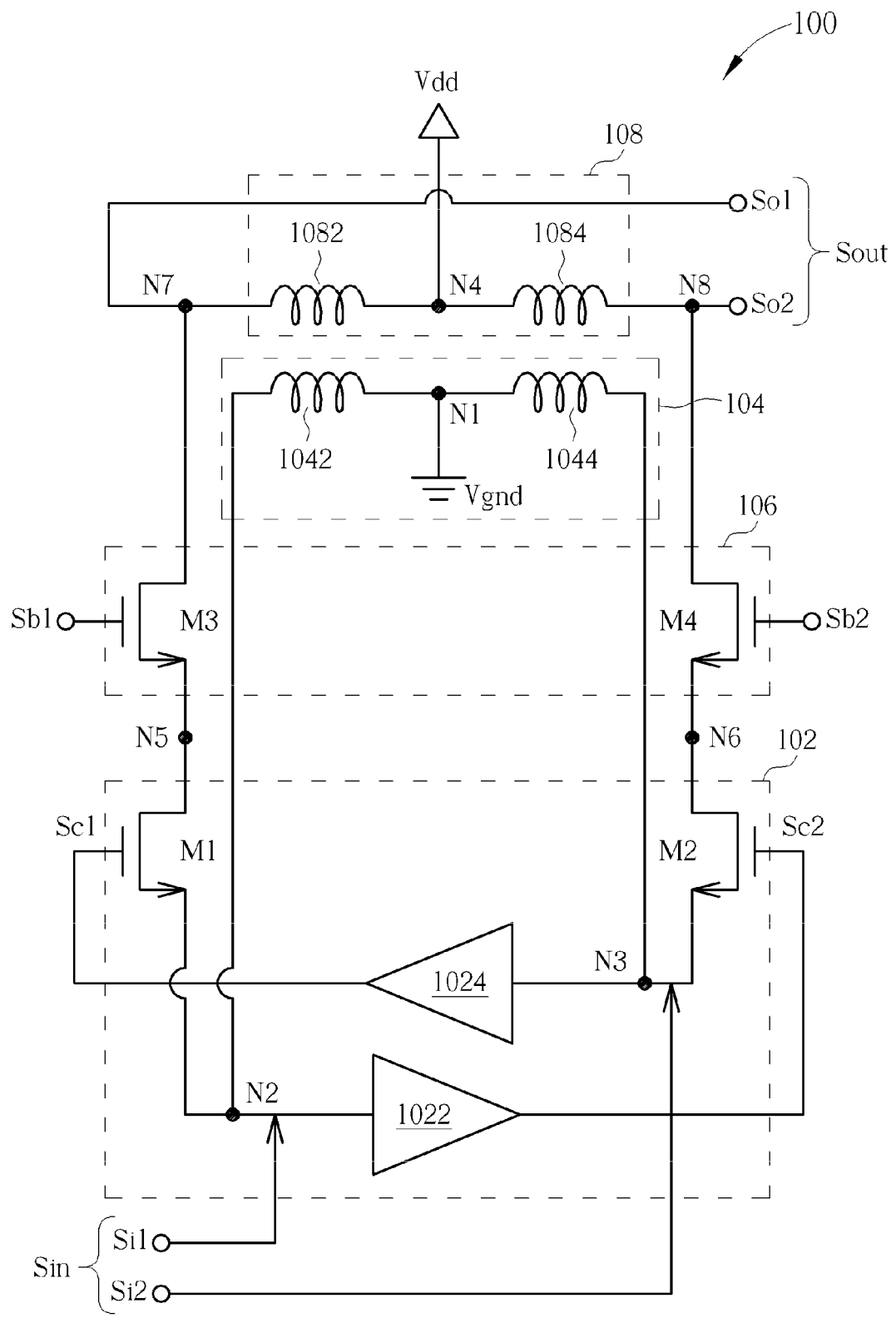
FIG. 1 is a diagram illustrating a signal amplifying circuit according to an embodiment of the present invention.

Please refer to FIG. 1. FIG. 1 is a diagram illustrating a signal amplifying circuit 100 according to an embodiment of the present invention. The signal amplifying circuit 100 may be a low noise amplifying circuit employed in a wireless receiver system for applying a low noise gain to an input signal Sin (denoted by Si1 and Si2 in FIG. 1) to generate an output signal Sout (denoted by So1 and So2 in FIG. 1). The signal amplifying circuit 100 includes, but is not limited to, an input stage circuit 102, a first inductive element 104, an output stage circuit 106 and a second inductive element 108. The input stage circuit 102 is utilized to receive the input signal Sin. The first inductive element 104 is coupled between the input stage circuit 102 and a first reference voltage (i.e., a ground voltage Vgnd). The output stage circuit 106 is utilized to generate the output signal Sout according to the input signal Sin. The second inductive element 108 is coupled between the output stage circuit 106 and a second reference voltage (i.e., a supply voltage Vdd). In this embodiment, at least a part of the winding of the first inductive element 104 is cross-coupled to at least a part of the winding of the second inductive element 108, thus introducing a coupling effect between the first inductive element 104 and the second inductive element 108. Furthermore, at least a part of the winding of the first inductive element 104 is cross-coupled to at least a part of the winding of the second inductive element 108, thus introducing a coupling effect between the first inductive element 104 and the second inductive element 108 to reduce the noise in the output signal Sout. It should be noted that the aforementioned exemplary cross-coupling of the winding is not meant to be a limitation of the present invention. In practice, any layout arrangement capable of introducing a coupling effect between the first inductive element 104 and the second inductive element 108 fall within the scope of the present invention. For instance, locating the first inductive element 104 adjacent to the second inductive element 108 in an embodiment could also introduce a coupling effect between the first inductive element 104 and the second inductive element 108, which also falls within the scope of the present invention.

In addition, the signal amplifying circuit 100 as shown in FIG. 1 is a differential low noise amplifying circuit; therefore the input stage circuit 102 includes, but is not limited to, a first field effect transistor M1 and a second field effect transistor M2. The first inductive element 104 is coupled between the first field effect transistor M1 and the second field effect transistor M2, and the first inductive element 104 has a center-tapped terminal N1 coupled to the first reference voltage (i.e., the ground voltage Vgnd). As can be seen from FIG. 1, the inductor set in the left of the center-tapped terminal N1 is designated with a reference numeral 1042, and the inductor set in the right of the center-tapped terminal N1 is designated with a reference numeral 1044. The first field effect transistor M1 has a first connection terminal N2 coupled to a first terminal of the first inductive element 104 and a first signal Si1 of the input signal Sin, and further has a control terminal utilized to receive a first control signal Sc1. The second field effect transistor M2 has a first connection terminal N3 coupled to a second terminal of the first inductive element 104 and a second signal Si2 of the input signal Sin, and further has a control terminal utilized to receive a second control signal Sc2.

The output stage circuit 106 also has a third field effect transistor M3 and a fourth field effect transistor M4 included therein. The second inductive element 108 has a center-tapped terminal N4 coupled to the second reference voltage (i.e., the supply voltage Vdd). As can be seen from FIG. 1, the inductor located in the left of the center-tapped terminal is designated with a reference numeral 1082, and the inductor located in the right of the center-tapped terminal is designated with a reference numeral 1084. The third field effect transistor M3 has a first connection terminal N5 coupled to a second connection terminal of the first field effect transistor M1, a control terminal utilized to receive a first bias signal Sb1, and a second connection terminal N7 coupled to a first terminal of the second inductive element 108 and utilized to output a first So1 of the output signal Sout. The fourth field effect transistor M4 has a first connection N6 coupled to a second connection terminal of the second field effect transistor M2, a control terminal utilized to receive a second bias signal Sb2, and a second connection terminal N8 coupled to a second terminal of the second inductive element 108 and utilized to output a second signal So2 of the output signal Sout.

In addition, the input stage circuit 102 of the present invention further includes a first amplifying circuit 1022 and a second amplifying circuit 1024. The first amplifying circuit 1022 has an input terminal coupled to the first connection terminal N2 of the first field effect transistor M1, and an output terminal coupled to the control terminal of the second field effect transistor M2. The first amplifying circuit 1022 is utilized to apply a first gain to the first signal Si1 of the input signal Sin to generate the second control signal Sc2. The second amplifying circuit 1024 has an input terminal coupled to the first connection terminal N3 of the second field effect transistor M2, and an output terminal coupled to the control terminal of the first field effect transistor M1. The second amplifying circuit 1024 is utilized to apply a second gain to the second signal Si2 of the input signal Sin to generate the first control signal Sc1. In this embodiment, the first gain substantially equals the second gain, where the first gain and the second gain are represented by "A". However, this is not meant to be a limitation of the present invention. Those skilled in the art could employ a first gain larger than a second gain or employ a first gain smaller than a second gain, depending upon actual circuit requirement. Moreover, regarding the signal amplifying circuit 100, the first amplifying circuit 1022 and the second amplifying circuit 1024 may be optional elements. For example, in another embodiment of the signal amplifying circuit of the present invention, the first amplifying circuit 1022 and the second amplifying circuit 1024 may be omitted. When the first amplifying circuit 1022 and the second amplifying circuit 1024 are omitted, the modified signal amplifying circuit could also have benefits substantially equal to that possessed by the signal amplifying circuit 100.

It should be noted that the field effect transistors M1, M2, M3, and M4 included in this embodiment are NMOS transistors. However, this is not meant to be a limitation of the present invention. The field effect transistors M1, M2, M3, and M4 may be implemented using N-type field effect transistors, P-type field effect transistors, or a combination of P-type field effect transistors and N-type field effect transistors.

According to the embodiment of the signal amplifying circuit 100 of the present invention, when the first inductive element 104 has a first inductor winding number X, the second inductive element 108 has a second inductor winding number Y, the winding ratio of the first inductor winding number X to the second inductor winding number Y is n, and the product of the winding ratio n and a coupling coefficient k corresponding to the coupling effect is not greater than 1, the noise figure F of the signal amplifying circuit 100 is inversely proportional to the product of the winding number n and the coupling coefficient k substantially, which may be expressed by the following equation (1):

$$F \propto \frac{(1-n*k)}{(A+1)}\left[\gamma + \frac{\delta}{5}\left(\frac{\omega}{\omega_T}\right)^2\right], \tag{1}$$

wherein, A is the gain of the first amplifying circuit 1022 and the second amplifying circuit 1024, $\gamma$ is the channel noise coefficient of the field effect transistor, $\delta$ is the gate noise coefficient of the field effect transistor, $\omega_T$ is the operating cutoff frequency of the field effect transistor, $\omega$ is the frequency of the operating signal (e.g., the input signal Sin or the output signal Sout). Therefore, on the premise that the product of the winding number n and the coupling coefficient k is not greater than 1, the larger is the product of the winding number n and the coupling coefficient k, the noise figure F of the signal amplifying circuit 100 is smaller. To put it another way, when there is a coupling effect between the first inductive element 104 and the second inductive element 108, the effect resulting from coefficients of the channel noise and the gate noise introduced by the common gate field effect transistors (M1, M2, M3, and M4) of the signal amplifying circuit 100 becomes smaller. Hence, the noise introduced to the output signal Sout by the signal amplifying circuit 100 becomes smaller correspondingly.

Moreover, as can be seen from equation (1) mentioned above, the noise figure F of the signal amplifying circuit 100 is inversely proportional to the gain A of the first amplifying circuit 1022 and the second amplifying circuit 1024 substantially. Hence, when the gain A of the first amplifying circuit 1022 and the second amplifying circuit 1024 becomes larger, the noise added to the output signal Sout due to the signal amplifying circuit 100 becomes smaller. It should be noted that, in this embodiment, a purpose of employing the first amplifying circuit 1022 and the second amplifying circuit 1024 in the signal amplifying circuit 100 is to enlarge the transconductance of the first field effect transistor M1 and the second field effect transistor M2 for increasing the gain of the signal amplifying circuit 100.

Figure 2:
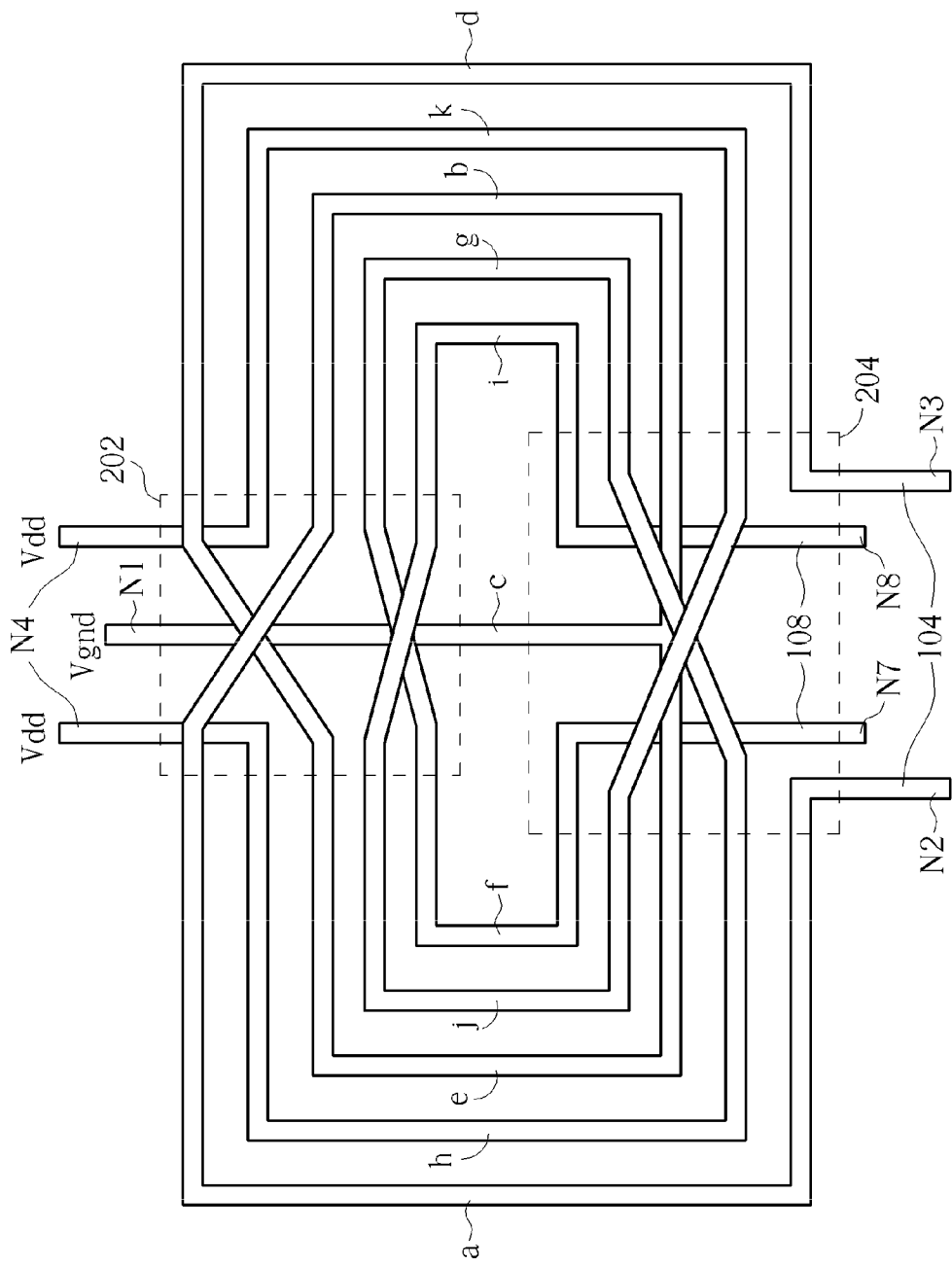
FIG. 2 is a diagram illustrating the first inductive element and the second inductive element according to an embodiment of the present invention.

In addition, in order to reduce the area of the signal amplifying circuit 100 for lowering the cost of the signal amplifying circuit 100, the winding of the first inductive element 104 is cross-coupled to the winding of the second inductive element 108, as shown in FIG. 2. FIG. 2 is a diagram illustrating the first inductive element 104 and the second inductive element 108 according to an embodiment of the present invention. As can be seen from FIG. 2, the two terminals of the first inductive element 104 are N2 (i.e., the first connection terminal N2 of the first field effect transistor M1) and N3 (i.e., the first connection terminal N3 of the second field effect transistor M2), respectively, and the two terminals of the second inductive element 108 are N7 (i.e., the second connection terminal N7 of the third field effect transistor M3) and N8 (i.e., the second connection terminal N8 of the fourth field effect transistor M4), respectively. In addition, the center-tapped terminal N1 of the first inductive element 104 is coupled to the ground voltage Vgnd, and the center-tapped terminal N4 of the second inductive element 108 is coupled to the supply voltage Vdd. Accordingly, the winding of the inductor 1042 of the first inductive element 104 comprises conduction traces a, b, and c, and the winding of the inductor 1044 comprises conduction traces d, e, and c. The winding of the inductor 1082 of the second inductive element 108 comprises conduction traces f, g, and h, and the winding of the inductor 1084 comprises conduction traces i, j, and k, wherein within the ranges respectively surrounded by the dotted lines 202 and 204, the conduction traces between the first inductive element 104 and the second inductive element 108 are cross-coupled to each other but not electrically connected to each other. In this way, the first inductive element 104 and the second inductive element 108 could be mutually coupled in the minimum area to introduce a coupling effect to reduce the noise of the output signal Sout.

Figure 3:
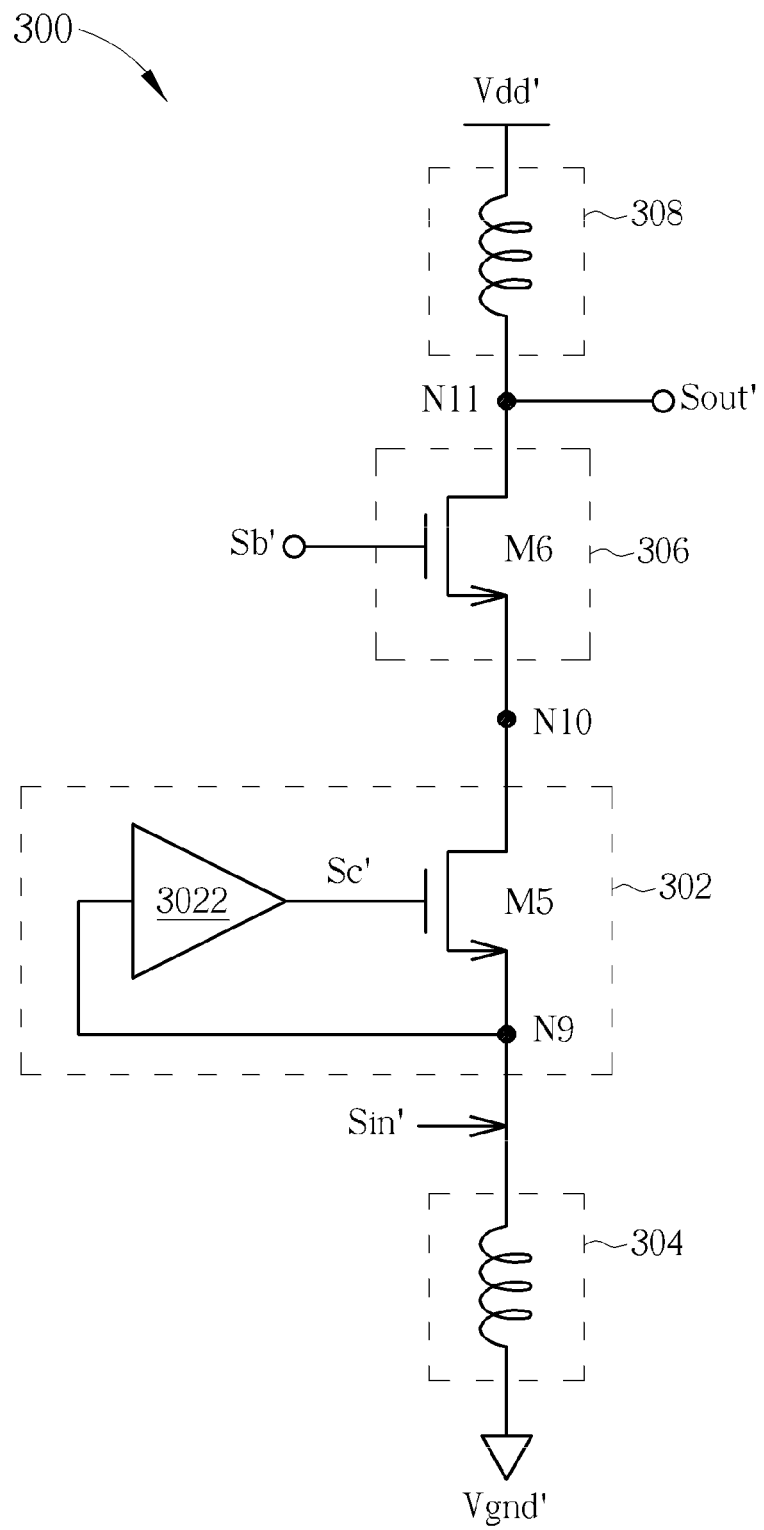
FIG. 3 is a diagram illustrating a signal amplifying circuit according to an embodiment of the present invention.

Moreover, the signal amplifying circuit of the present invention is not limited to the design of a differential architecture. As shown in FIG. 3, technical features of the present invention may be applicable to the design of a single-ended architecture. FIG. 3 is a diagram illustrating a signal amplifying circuit 300 according to an embodiment of the present invention. The signal amplifying circuit 300 may be a low noise amplifying circuit employed in a wireless receiver system for providing a low noise gain to an input signal Sin' to generate an output signal Sout'. The signal amplifying circuit 300 includes, but is not limited to, an input stage circuit 302, a first inductive element 304, an output stage circuit 306, and a second inductive element 308. The input stage circuit 302 is utilized to receive the input signal Sin'. The first inductive element 304 is coupled between the input stage circuit 302 and a first reference voltage (i.e., a ground voltage Vgnd'). The output stage circuit 306 is utilized to generate the output signal Sout' according to the input signal Sin'. The second inductive element 308 is coupled between the output stage circuit 306 and a second reference voltage (i.e., a supply voltage Vdd'). At least a part of the winding of the first inductive element 304 is cross-coupled to at least a part of the winding of the second inductive element 308, thus introducing a coupling effect between the first inductive element 304 and the second inductive element 308. Furthermore, at least a part of the winding of the first inductive element 304 is cross-coupled to at least a part of the winding of the second inductive element 308, thus introducing a coupling effect between the first inductive element 104 and the second inductive element 108 to reduce the noise of the output signal Sout'. It should be noted that the aforementioned exemplary cross-coupling of the winding is not meant to be a limitation of the present invention. In practice, any layout arrangements capable of having a coupling effect between the first inductive element 304 and the second inductive element 308 fall within the scope of the present invention. For instance, locating the first inductive element 304 adjacent to the second inductive element 308 in an embodiment could also introduce a coupling effect between the first inductive element 304 and the second inductive element 308, which also falls within the scope of the present invention.

The signal amplifying circuit 300 shown in FIG. 3 is a single-ended low noise amplifying circuit, wherein the input stage circuit 302 may includes a first field effect transistor M5. The first inductive element 304 is coupled between the first field effect transistor M5 and the ground voltage Vgnd'. The first field effect transistor M5 has a first connection terminal N10 coupled to a first terminal of the first inductive element 104 and the input signal Sin', and a control terminal utilized to receive a control signal Sc.

The output stage circuit 306 also includes a second field effect transistor M6. The second field effect transistor M6 has a first connection terminal N10 coupled to a second connection terminal of the first field effect transistor M5, a control terminal utilized to receive a bias voltage signal Sb', and a second connection terminal N11 coupled to a first terminal of the second inductive element 308 and utilized to output the output signal Sout'. A second terminal of the second inductive element 308 is coupled to the supply voltage Vdd'.

In addition, the input stage circuit 302 of the present invention further includes an amplifying circuit 3022. The amplifying circuit 3022 has an input terminal coupled to the first connection terminal N9 of the first field effect transistor M5, and an output terminal coupled to the control terminal of the second field effect transistor M5. The first amplifying circuit 3022 is utilized to apply a gain to the input signal Sin' to generate the control signal Sc'. Regarding the signal amplifying circuit 300, the amplifying circuit 3022 may be an optional element. For example, in another embodiment of the signal amplifying circuit of the present invention, the amplifying circuit 3022 may be omitted. When the first amplifying circuit 3022 is omitted, the modified signal amplifying circuit could also have benefits substantially identical to that possessed by the signal amplifying circuit 300. Besides, in order to reduce the area of the signal amplifying circuit 300 for lowering the cost of the signal amplifying circuit 300, the winding of the first inductive element 304 may be cross-coupled to the winding of the second inductive element 308, as shown in FIG. 2.

It should be noted that the field effect transistors M5 and M6 in this embodiment are NMOS transistors. However, this is not meant to be a limitation of the present invention. The field effect transistors M5 and M6 may be implemented using N-type field effect transistors, P-type field effect transistors, or a combination of a P-type field effect transistor and an N-type field effect transistor. Besides, in this embodiment, the method to reduce the noise of the output signal Sout' (i.e., utilizing the amplifying circuit 3022 and the coupling effect between the first inductive element 304 and the second inductive element 308) is similar to the method employed by the signal amplifying circuit 100. Hence, the above equation (1) also could be applied to the signal amplifying circuit 300. As a person skilled in the art can readily understand the operational principle of the signal amplifying circuit 300 after reading above paragraphs directed to the signal amplifying circuit 100, further description is omitted here for brevity.

Figure 4:
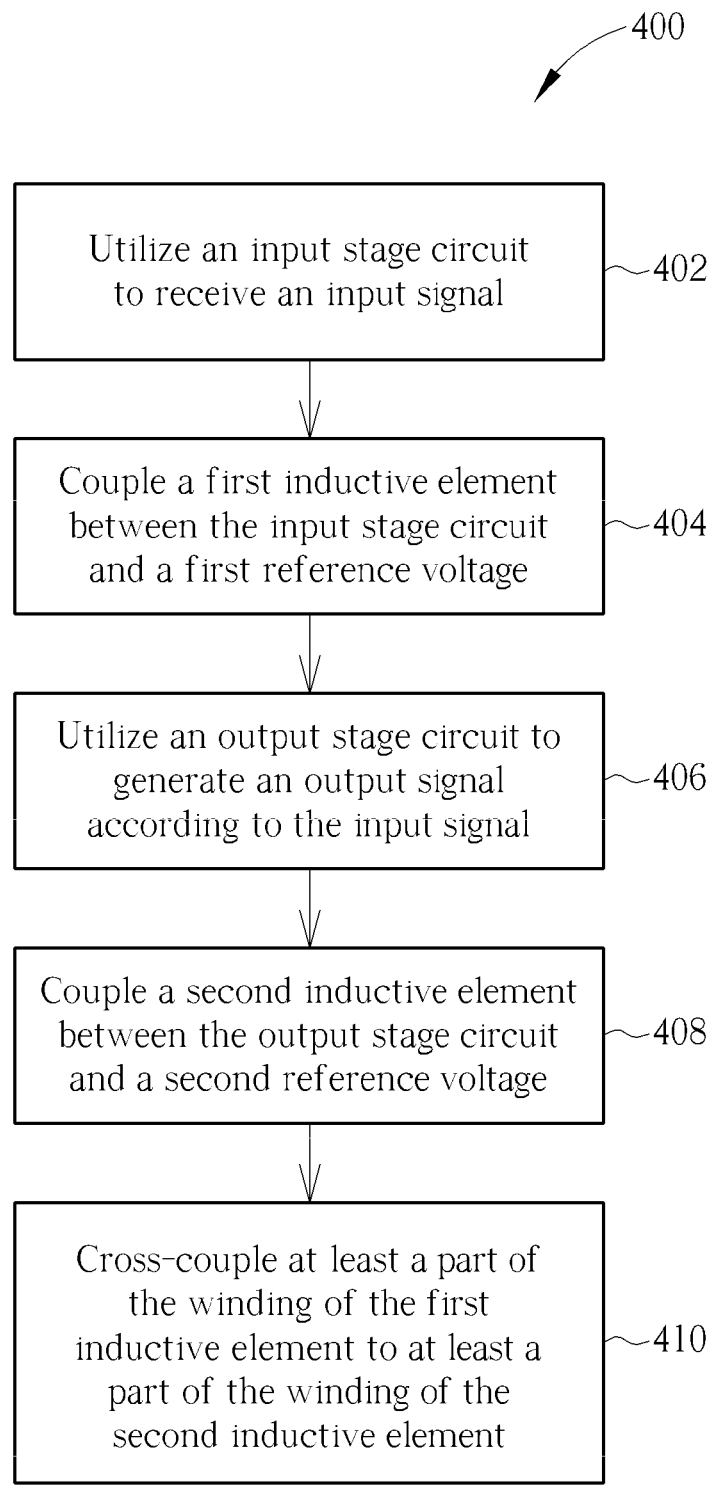
FIG. 4 is a flowchart of a signal amplifying method according to an embodiment of the present invention.

The methods employed by the signal amplifying circuits 100 and 300 described above could be simplified by following steps 402-410 as shown in FIG. 4. FIG. 4 is a flowchart of a signal amplifying method 400 according to an embodiment of the present invention. Provided that the result is substantially the same, the steps of the flowchart shown in FIG. 4 need not be in the exact order shown and need not be contiguous, that is, other steps can be intermediate. The signal amplifying method 400 includes following steps:

Step 402: Utilize an input stage circuit to receive an input signal;

Step 404: Couple a first inductive element between the input stage circuit and a first reference voltage;

Step 406: Utilize an output stage circuit to generate an output signal according to the input signal;

Step 408: Couple a second inductive element between the output stage circuit and a second reference voltage; and Step 410: Cross-couple at least a part of the winding of the first inductive element to at least a part of the winding of the second inductive element.

In the signal amplifying method 400 of this embodiment, at least a part of the winding of the first inductive element is cross-coupled to at least a part of the winding of the second inductive element, such that a coupling effect between the first inductive element and the second inductive element is introduced for reducing the noise in the output signal Sout. Furthermore, as can be seen from equation (1) mentioned above, the product of a ratio of the first inductor winding number to the second inductor winding number and a coupling coefficient corresponding to the coupling effect is not greater than 1. In this way, the coupling effect between the first inductive element and the second inductive element could effectively compensate the channel noise and the gate noise introduced by the common gate field effect transistors included in the low noise amplifying circuit.

In summary, the present invention proposes a low noise amplifying circuit with at least a part of the winding of the first inductive element cross-coupled to at least a part of the winding of the second inductive element, thus introducing a coupling effect between the first inductive element and the second inductive element for reducing the noise in the output signal. In addition, the present invention proposes using a cross-coupled circuit layout of the input inductive element and the output inductive element to introduce a coupling effect. In this way, the input inductive element and the output inductive element could be mutually coupled in the minimum area to reduce the noise in the output signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal amplifying circuit, comprising:
an input stage circuit, arranged for receiving an input signal;
a first inductive element, coupled between the input stage circuit and a first reference voltage, for receiving the input signal;
an output stage circuit, arranged for generating an output signal according to the input signal; and
a second inductive element, coupled between the output stage and a second reference voltage;
wherein at least a part of the winding of the first inductive element is cross-coupled to at least a part of the winding of the second inductive element.

2. The signal amplifying circuit of claim 1, wherein at least a part of the winding of the first inductive element is cross-coupled to at least a part of the winding of the second inductive element, thus a coupling effect is introduced between the first inductive element and the second inductive element.

3. The signal amplifying circuit of claim 2, wherein the first inductive element has a first inductance winding number, the second inductive element has a second inductance winding number, and a product of a ratio of the first inductance winding number to the second inductance winding number and a coupling coefficient corresponding to the coupling effect is not greater than 1.

4. The signal amplifying circuit of claim 3, wherein a first terminal of the first inductive element is coupled to the first reference voltage, and a second terminal is arranged for receiving the input signal;
wherein the input stage circuit comprises:
a first field effect transistor, comprising a first connection terminal coupled to the second terminal of the first inductive element, and a control terminal arranged for receiving a control signal;
wherein the output stage circuit comprises:
a second field effect transistor, comprising a first connection terminal coupled to a second connection terminal of the first field effect transistor, and a control terminal arranged for receiving a bias signal; and
wherein a first terminal of the second inductive element is coupled to a second connection terminal of the second field effect transistor and a second terminal arranged for coupling to the second reference voltage.

5. The signal amplifying circuit of claim 4, wherein the input stage circuit further comprises:
an amplifying circuit, comprising an input terminal coupled to the first connection terminal of the first field effect transistor, and an output terminal coupled to the control terminal of the first field effect transistor, the amplifying circuit arranged for providing a gain not greater than 0 to the input signal to generate the control signal.

6. The signal amplifying circuit of claim 3, wherein the first inductive element comprises a center-tapped terminal coupled to the first reference voltage;
wherein the input stage circuit comprises:
a first field effect transistor, comprising a first connection terminal coupled to a first terminal of the first inductive element and a first signal of the input signal, and a control terminal arranged for receiving a first control signal; and
a second field effect transistor, comprising a first connection terminal coupled to a second terminal of the first inductive element and a second signal of the input signal, and a control terminal arranged for receiving a second control signal;
wherein the second inductive element comprises a center-tapped terminal coupled to the second reference voltage;
wherein the output stage circuit comprises:
a third field effect transistor, comprising a first connection terminal coupled to a second connection terminal of the first field effect transistor, a control terminal arranged for receiving a first bias signal, a second connection terminal coupled to a first terminal of the second inductive element, and a first signal arranged for outputting the output signal; and
a fourth field effect transistor, comprising a first connection terminal coupled to a second connection terminal of the second field effect transistor, a control terminal arranged for receiving a second bias signal, a second connection terminal coupled to a second terminal of the second inductive element, and a second signal arranged for outputting the output signal.

7. The signal amplifying circuit of claim 6, wherein the input stage circuit further comprises:
   a first amplifying circuit, comprising an input terminal coupled to the first connection terminal of the first field effect transistor, an output terminal coupled to the control terminal of the second field effect transistor, the first amplifying circuit arranged for providing a first gain to the first signal of the input signal to generate the second control signal.

8. The signal amplifying circuit of claim 7, wherein the input stage circuit further comprises:
   a second amplifying circuit, comprising an input terminal coupled to the first connection terminal of the second field effect transistor, an output terminal coupled to the control terminal of the first field effect transistor, the second amplifying circuit arranged for providing a second gain to the second signal of the input signal to generate the first control signal.

9. The signal amplifying circuit of claim 8, wherein the first gain substantially equals to the second gain.

10. The signal amplifying circuit of claim 1, wherein the first reference voltage is a grounding voltage and the second reference voltage is a source voltage.

11. A signal amplifying method, comprising:
   employing an input stage circuit to receive an input signal;
   coupling a first inductive element between the input stage circuit and a first reference voltage for receiving the input signal;
   employing an output stage circuit to generate an output signal according to the input signal;
   coupling a second inductive element between the output stage circuit and a second reference voltage; and
   cross-coupling at least a part of the winding of the first inductive element to at least a part of the winding of the second inductive element.

12. The signal amplifying method of claim 11, wherein at least a part of the winding of the first inductive element is cross-coupled to at least a part of the winding of the second inductive element, thus a coupling effect is introduced between the first inductive element and the second inductive element.

13. The signal amplifying method of claim 12, wherein the first inductive element has a first inductance winding number, the second inductive element has a second inductance winding number, and a product of a ratio of the first inductance winding number to the second inductance winding number and a coupling coefficient corresponding to the coupling effect is not greater than 1.

14. The signal amplifying method of claim 11, wherein the first reference voltage is a grounding voltage and the second reference voltage is a source voltage.

* * * * *